United States Patent [19]

Breeden et al.

[11] Patent Number: 5,449,407
[45] Date of Patent: Sep. 12, 1995

[54] EXPANSION COMPENSATED PRECISION EXTRUSION APPARATUS

[75] Inventors: Philip J. Breeden, Atherton; Adam J. Bell, San Jose; Joram Diamant, Moraga; Edmund S. Lewandowski, Campbell, all of Calif.

[73] Assignee: Sophia Systems Co., Ltd., San Jose, Calif.

[21] Appl. No.: 191,386

[22] Filed: Feb. 1, 1994

Related U.S. Application Data

[62] Division of Ser. No. 70,551, Jun. 1, 1993, Pat. No. 5,376,414.

[51] Int. Cl.$^6$ ............... B05B 15/00; B05B 9/047; B67D 5/40
[52] U.S. Cl. .................... 118/323; 118/407; 118/410; 222/386; 425/376.1
[58] Field of Search ............ 118/300, 323, 410, 407; 222/386, 571; 425/376.1

[56] References Cited

U.S. PATENT DOCUMENTS

| | | | |
|---|---|---|---|
| 2,619,116 | 11/1952 | Ralston | 222/571 |
| 3,547,148 | 12/1970 | Drori | 222/571 |
| 4,516,702 | 5/1985 | Schmidt | 222/571 |
| 4,622,239 | 11/1986 | Schoenthaler et al. | 118/410 |
| 4,635,827 | 1/1987 | Roedig | 118/410 |
| 4,951,848 | 8/1990 | Keller | 222/386 |
| 4,999,136 | 3/1991 | Su et al. | 252/512 |
| 5,056,687 | 10/1991 | Claassen | 118/410 |

Primary Examiner—Steve Alvo
Assistant Examiner—Steven P. Griffin
Attorney, Agent, or Firm—Albert C. Smith

[57] ABSTRACT

Extrusion apparatus and method includes a chamber of alterable volume having an outlet and a vent in a movable wall of the chamber to facilitate sealing the chamber upon application of force to the movable wall to displace viscous, fluid composition from within the chamber through the outlet and along a desired path. After displacement of a volume of the composition from the chamber, the vent is relieved to promote expansion of the composition within the chamber through the vent rather than through the outlet. The composition may be cured to substantially non-fluid condition along the desired path in response to applied thermal and/or ultraviolet radiant energy to provide traces of selected electrical properties on a work surface. The composition may be formulated, mixed and loaded into the chamber without compressible gas-filled pockets or voids in the volume of such composition that is confined within the chamber, thereby preserving direct correlation between the volume of the composition displaced from the chamber and the uniform width and thickness of an extruded trace.

11 Claims, 1 Drawing Sheet

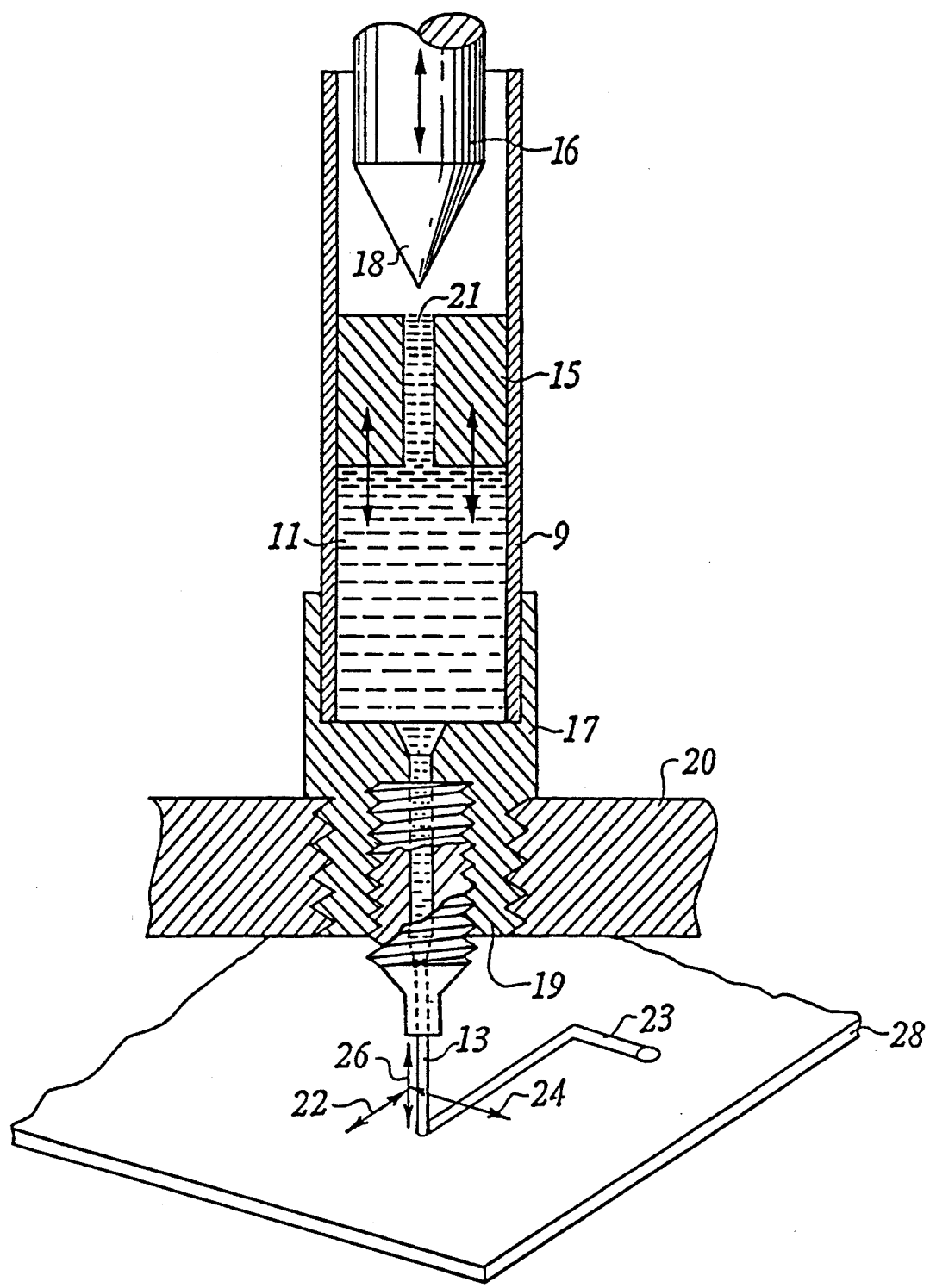

EXPANSION COMPENSATED PRECISION EXTRUSION APPARATUS

This is a divisional of application Ser. No. 08/070,551 filed on Jun. 1, 1993, now U.S. Pat. No. 5,376,414.

RELATED CLASS

The subject matter of this application relates to the subject matter disclosed in U.S. Pat. Nos. 5,099,090 and 5,156,772.

1. Field of the Invention

This invention relates to precision extrusion apparatus for extruding conductive traces on circuit boards, and more particularly to precision extrusion apparatus and method for reducing the effects of thermal expansion of the extrudable composition upon the quality and accuracy of conductive traces formed thereby.

2. Background of the Invention

Electronic circuit boards for supporting and connecting electronic components are commonly produced using etching techniques that remove conductive material such as a continuous layer of copper foil adhered to an insulating layer in regions where connections are not desired, leaving traces of continuous conductive foil where desired between circuit nodes. Substantial amounts of the original conductive foil are commonly removed from the initial laminate of continuous conductive foil to produce the desired circuit traces in this manner.

Recent developments in polymers that are heavily loaded with metallic silver particles facilitate the fabrication of circuit boards permitting extrusion of the desired circuit traces on an insulating layer directly in the desired circuit traces. Such polymers are conductive and may be extruded along paths that are determined according to computer-controlled movements of coordinated stages to 'write' the circuit traces between circuit nodes on an insulating layer. Polymers commonly used for this purpose typically rely upon multiple-solvent chemistry to provide quickly-setting conductive traces that can then be overcoated with insulative materials to promote additional extrusions of circuit traces that intersect, but do not connect to, the initially-extruded circuit traces. Complex circuit traces formed and initially set in this manner then require complete curing, for example, by baking at elevated temperatures in an oven, in order to fully cure the circuit traces in place on the insulating layer. One disadvantage of such systems is that the polymers expand as temperature increases, causing expansion of the volume of the viscous composition contained within an extruding vessel. Expansion of the composition within the extruding vessel commonly causes dribbling of the composition from an extruding tip which, when deposited on an insulating layer at the start of a conductive trace, can produce an unsightly, anomalous trace configuration that may undesirably overlap and connect to adjacent circuit traces.

SUMMARY OF THE INVENTION

In accordance with the present invention, viscous polymer composition that fully cures in response to ultraviolet or thermal radiation is extruded in precision manner by positive displacement from a chamber that houses a volume of the composition. A valve mechanism associated with a plunger that positively displaces the composition from the chamber relieves the effects of thermal expansion of the composition within the chamber and thereby eliminates dribbling from an extrusion tip. The valve mechanism is operable between strokes of positive displacement to assure that no portion of the composition within the chamber leaks or dribbles out of an extrusion tip when not in use.

DESCRIPTION OF THE DRAWINGS

The drawing is a pictorial cutaway sectional diagram of the generally cylindrical components of the chamber, plunger and valving mechanism of an extruder according to the present invention.

DESCRIPTION OF THE PREFERRED EMBODIMENT

Referring now to the drawing, there is shown a sectional view of a generally cylindrical chamber 9 for containing a volume of a viscous composition 11 that is to be extruded through an extrusion tip 13 in response to displacing movement of generally-cylindrical, close-fitting plunger 15 within the chamber 9. The base of the chamber 17 may be attached to the chamber 9, for example, using epoxy adhesive to provide a threaded ferrule 19 for mechanical attachment to apparatus 20 that guides the extrusion tip 13 in conventional manner along multiple coordinate axis 22, 24, 26 over the course of a desired circuit trace 23 on an insulating layer 28. Additionally, the ferrule 19 may include internal threads to mate with threads carried on the extrusion tip 13 to facilitate easy replacement of extrusion tips 13, as required.

The plunger 15 closely fits within the walls of the chamber 9 to provide a sliding seal therewith for positively displacing the viscous composition 11 from the chamber in response to sliding movement of the plunger 15 within the chamber 9. The plunger 15 includes a central aperture 21 that is axially aligned therethrough to serve as a thermal expansion vent for the volume of composition 11 that is confined within the chamber 9 between the base 17 and the plunger 15. An actuator 16 may be positioned in axial alignment with the chamber 9, and includes a tapered end 18 forming a valve means that is oriented to engage the plunger 15 within the aperture 21 for forcing the plunger 15 in the displacement direction and for forming a seal over the aperture 21 as displacing force is applied to the plunger 15 via the actuator 16. The tapered end 18 of the actuator 16 assures positive sealing of the aperture 21 as displacing force is applied to the plunger 15, and ensure release of the valve and seat thus formed as the actuator 16 is retracted away from the plunger 15. In a preferred embodiment, the plunger 15 may be formed of a stiffly compliant material such as TEFLON (commercially available from the Dupont de Nemour Company) which may also be deformed radially by engagement of the tapered actuator 16 in the aperture 21 to ensure formation of an improved sliding, sealing engagement of the plunger 15 with the inner walls of the chamber 9 which may, for example, be formed of glass.

The viscous composition 11 in one embodiment (for forming electrically conductive circuit traces 23) may include minute silver flakes dispersed within an ultraviolet-curable resin having a viscosity at room temperature of about 100,000 centipoise. Alternatively, the composition 11 for forming electrically-insulating overlays may include a similar ultraviolet-curable resin (without silver flakes dispersed therein) having a viscosity at room temperature of about 100,000 centipoise. Compositions of these types may be curable to hardened, non-viscous state in response to ultraviolet radiation or heat, or the like, and are commercially available, for example, from Dymax Company. For forming circuit traces 23, an internal passage through the extrusion tip 13 may have an internal diameter of about 2 to 15 mils. Thus, the various viscous compositions 11 within chamber 9 will not dribble or leak from the respective extrusion tips 13 without being forcefully displaced from the chamber 9. Therefore, to compensate for any thermal expansion of the composition 11 within chamber 9 attributable, for example, to compressive forces, environmental temperature changes, and the like, the diameter of the aperture 21 through plunger 15 is selected to be very much larger, and offer very much smaller capillary opposing force to viscous flow therethrough than through the internal passage of the extrusion tip 13, and typically about 5 to 10 times larger in diameter than the diameter of the internal passage through the extrusion tip 13. The composition 11 may be supplied to the chamber 9 from one end, for example from the base end 17 to flow into and completely fill the chamber 9 and the aperture 21 in the plunger 15. Thus, in operation, the tapered actuator 16 displaces an initial, small volume of the composition 11 residing in the aperture until the taper fully engages the walls of the aperture 21 to form a seal therewith, and thereby completely seal off the confined volume of composition 11 for positive displacement through extrusion tip 13 in direct proportion to the displacement movement of the plunger 15 within the chamber 9. To form a trace 23 of selected width and thickness on a work surface of an insulating layer 28, the required displacement movement of the plunger 15 thus remains directly proportional to the distance over which the trace 23 is formed. Upon completion of an extruded trace 23, the actuator 16 may be retracted slightly to unseal the aperture 21 and thereby open the expansion vent for chamber 9 to promote any expansion of the composition 11 through the aperture 21 rather than through the extrusion tip 13.

Therefore, the apparatus and method of the present invention provide improved control over the extrusion of viscous compositions and promote reliable extrusions of uniform circuit traces free from anomalies and undesirable leaks of the viscous compositions.

We claim:

1. Extrusion apparatus comprising:
    a chamber having boundary walls and including a movable boundary wall for altering the volume within the chamber, the movable boundary wall including an aperture therein in communication with the volume within the chamber;
    actuator means disposed to communicate with said movable wall for exerting force on the movable wall relative to the chamber to move the movable wall for altering the volume within the chamber;
    valve means responsive to the exertion of force by the actuator means on the movable wall for sealing said aperture and the volume within the chamber; and
    an outlet coupled to the chamber.

2. Extrusion apparatus according to claim 1 wherein said outlet includes an extrusion tip for directing volume displaced through said outlet from the chamber.

3. Extrusion apparatus according to claim 2 including means coupled to the extrusion tip for manipulating the position of the extrusion tip relative to a work surface.

4. Extrusion apparatus according to claim 1 wherein said chamber includes a substantially cylindrical boundary wall and said movable wall includes a plunger slidably disposed within the cylindrical boundary wall of the chamber and forming a fluid-tight slidable seal therewith; and comprising:
    viscous, fluid composition contained within the chamber.

5. Extrusion apparatus according to claim 1 wherein said actuator means includes a tapered region forming said valve means that is disposed to communicate with the aperture in said movable wall for forming a seal over the aperture upon engagement therewith by the tapered region.

6. Extrusion apparatus according to claim 1 including viscous, fluid composition contained within the chamber that is curable to non-fluid physical condition in response to radiant energy applied thereto.

7. Extrusion apparatus according to claim 6 wherein said composition includes resin that is curable to substantially non-fluid condition in response to at least one of ultraviolet and thermal radiation applied thereto.

8. Extrusion apparatus according to claim 7 wherein said composition includes conductive material dispersed therein for forming electrically conductive traces of cured composition.

9. Extrusion apparatus according to claim 1 including a base attached to the chamber and forming a fluid-tight seal therewith for supporting the chamber relative to the actuator means exerting force on the movable wall.

10. Extrusion apparatus according to claim 9 wherein said outlet is formed in the base to permit flow therethrough of volume displaced from the chamber.

11. Extrusion apparatus according to claim 1 wherein the cross section of the aperture is substantially larger than the cross section of the outlet to promote expansion of the volume within the chamber through the aperture more readily than through the outlet.

* * * * *